US009069925B2

(12) United States Patent  (10) Patent No.: US 9,069,925 B2
Wann  (45) Date of Patent: Jun. 30, 2015

(54) METHOD FOR CONSTANT POWER DENSITY SCALING

(71) Applicant: Taiwan Semiconductor Manufacturing Company, Ltd., Hsin-Chu (TW)

(72) Inventor: Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 56 days.

(21) Appl. No.: 13/742,165

(22) Filed: Jan. 15, 2013

(65) Prior Publication Data
US 2013/0132923 A1  May 23, 2013

Related U.S. Application Data

(62) Division of application No. 12/828,591, filed on Jul. 1, 2010, now Pat. No. 8,375,349.

(60) Provisional application No. 61/239,335, filed on Sep. 2, 2009.

(51) Int. Cl.
*G06F 9/455* (2006.01)
*G06F 17/50* (2006.01)
(52) U.S. Cl.
CPC .................................. *G06F 17/5068* (2013.01)
(58) Field of Classification Search
CPC ............ G06F 17/5072; G06F 17/5068; G06F 2217/78; G06F 17/50; G06F 17/5077; G06F 17/5081
See application file for complete search history.

(56) References Cited

U.S. PATENT DOCUMENTS

| 5,477,467 A  * | 12/1995 | Rugg ............................ 716/132 |
| 6,111,277 A    | 8/2000  | Ikeda |
| 7,194,725 B1 * | 3/2007  | Lukanc et al. .................. 716/52 |
| 7,198,971 B2   | 4/2007  | Shin |

(Continued)

FOREIGN PATENT DOCUMENTS

| JP | 01273178 | 1/1989 |
| JP | 2002110808 | 4/2002 |

(Continued)

OTHER PUBLICATIONS http://www.epistar.com.tw/img/pdf/ES-CEBHM12A.pdf, "InGaN Blue LED Chip," ES-CEBHM12A, Epistar Corporation, 2008, CC-200812-A, 1 pg.

(Continued)

*Primary Examiner* — Nha Nguyen
(74) *Attorney, Agent, or Firm* — Slater & Matsil, L.L.P.

(57) ABSTRACT

A method for constant power density scaling in MOSFETs is provided. A method for manufacturing an integrated circuit includes computing fixed scaling factors for a first fabrication process based on a second fabrication process, computing settable scaling factors for the integrated circuit to be fabricated using the first fabrication process, determining parameters of the integrated circuit based on the settable scaling factors, and manufacturing the integrated circuit using the determined parameters. The first fabrication process creates devices having a smaller device dimension than the second fabrication process and the settable scaling factors are set based on the fixed scaling factors.

20 Claims, 4 Drawing Sheets

(56) References Cited

U.S. PATENT DOCUMENTS

| | | | |
|---|---|---|---|
| 7,783,995 B2* | 8/2010 | Joshi | 716/103 |
| 8,375,349 B2* | 2/2013 | Wann | 716/135 |
| 8,377,796 B2 | 2/2013 | Yu et al. | |
| 2002/0042905 A1 | 4/2002 | Shirotori et al. | |
| 2003/0006438 A1* | 1/2003 | Arima | 257/288 |
| 2003/0084418 A1* | 5/2003 | Regan | 716/14 |
| 2005/0086619 A1 | 4/2005 | The et al. | |
| 2008/0222578 A1* | 9/2008 | Joshi | 716/3 |
| 2010/0095252 A1* | 4/2010 | Schultz | 716/1 |
| 2010/0264425 A1* | 10/2010 | Miller et al. | 257/76 |

FOREIGN PATENT DOCUMENTS

| | | |
|---|---|---|
| TW | 200627213 | 8/2006 |
| TW | 200807575 A | 2/2008 |

OTHER PUBLICATIONS http://www.epistar.com.tw/img/pdf/ES-CEBLV13.pdf, "InGaN Venus Blue Chip," ES-CEBVL13, Epistar Corporation, 2008, CC-200810-A, 1 pg.

http://www.epistar.com.tw/img/pdf/ES-CADBV24B.pdf, "InGaN Venus Blue LED Chip," ES-CADBV24B, Epistar Corporation, 2008, CC-200810-A, 2 pgs.

http://www.epistar.com.tw/img/pdf/ES-CADBV45B.pdf, "InGaN Venus Blue LED Chip," ES-CADBV45B, Epistar Corporation, 2008, CC-200807-B, 2 pgs.

Davari, B., et al., "CMOS Scaling for High Performance and Low Power—The Next Ten Years," Proceedings of the IEEE, vol. 83, No. 4, Apr. 1995, pp. 595-606.

Hiramatsu, K. et al., "Fabrication and characterization of low defect density GaN using facet-controlled epitaxial lateral overgrowth (FACELO)," Journal of Crystal Growth 221 (2000), pp. 316-326, Elsevier Science B.V.

Horowitz, M., et al., "Scaling, Power, and the Future of CMOS," IEEE, 2005, 7 pages.

Zamir, S. et al., "Lateral confined epitaxy of GaN layers on Si substrates," Journal of Crystal Growth 230 (2001), pp. 341-345, Elsevier Science B.V.

Zubia, D. et al., "Nanoheteroepitaxy: The Application of nanostructuring and substrate compliance to the heteroepitaxy of mismatched semiconductor materials," Jornal of Applied Physics, vol. 85, No. 9, May 1, 1999, pp. 6492-6496.

Haensch, W., et al., "Silicon CMOS Devices Beyond Scaling," IBM J. Res. & Dev., vol. 50, No. 4/5, Jul./Sep. 2006, pp. 339-361A.

White, Mark, et al., "Scaled CMOS Technology Reliability Users Guide," Jet Propulsion Laboratory Publication 08-14 3/08, 2008, 27 pages.

* cited by examiner

METHOD FOR CONSTANT POWER DENSITY SCALING

This application claims the benefit of U.S. patent application Ser. No. 12/828,591, filed on Jul. 1, 2010, entitled "Method for Constant Power Density Scaling," which claims the benefit of U.S. Provisional Patent Application Ser. No. 61/239,335, filed on Sep. 2, 2009, and entitled "Method for Constant Power Density Scaling," both of which applications are incorporated herein by reference.

TECHNICAL FIELD

The present disclosure relates generally to integrated circuits, and more particularly to MOSFETs.

BACKGROUND

Silicon CMOS device technology has shrunken device dimensions by more than an order of magnitude, and is expected to continue to shrink device dimensions down into the sub-5 nm range within the decade. While continuing advances in manufacturing has enabled the reduction in device dimensions, device scaling poses serious challenges at the circuit and system levels. Challenges include reduced power supply voltages, increased leakage currents, decreased reliability, and severely increased power density of integrated systems.

FIG. 1 illustrates data plots of power supply voltage level versus device dimension (shown as trace 105) and power density versus device dimension (shown as trace 110). As device dimensions shrunk from about 0.5 um down to about 0.13 um (shown in span 115), a technique known as constant field scaling was used to scale power supply voltage level along with the shrinking device dimensions. In constant field scaling, the power supply voltage levels scale in proportion with the device dimension. An added bonus with constant field scaling as device dimensions shrunk from 0.5 um to 0.13 um is that power density remained substantially constant.

Then, as device dimensions shrunk from about 130 nm down to about 32 nm (shown as span 120), constant field scaling was no longer effective, since the rapid drop in power supply voltage levels made integrated circuits susceptible to noise and presented reliability issues. Instead, power supply voltage levels were kept nearly constant while drive current per device width increased. Performance boosters, such as strained substrate technology, and so forth, were used to help increase drive current per device width. The nearly constant power supply voltage along with increased drive current per device width has led to a dramatic increase in power density, which may lead to problems such as heat dissipation from the integrated circuit as well as potentially decreased device life due to overheating.

Clearly, the drastic increase in power density may not be able to continue as device dimensions continue to shrink down to 32 nm and below (shown as span 125) due to heat related problems. Ideally, the power density should remain constant or even decrease as device dimensions continue to decrease (shown as trace 130). In order to achieve relatively constant power density, it may be necessary to reduce power supply voltage levels (shown as trace 135).

SUMMARY

In accordance with an embodiment, a method for manufacturing an integrated circuit is provided. The method includes computing fixed scaling factors for a first fabrication process based on a second fabrication process, computing settable scaling factors for the integrated circuit to be fabricated using the first fabrication process, determining parameters of the integrated circuit based on the settable scaling factors; and manufacturing the integrated circuit using the determined parameters. The first fabrication process creates devices having a smaller device dimension than the second fabrication process, and the settable scaling factors are set based on the fixed scaling factors.

In accordance with another embodiment, a method for manufacturing an integrated circuit is provided. The method includes providing a design for the integrated circuit, changing the design to a second fabrication process, computing settable scaling factors for the integrated circuit based on the first fabrication process and the second fabrication process, setting integrated circuit parameters based on the settable scaling factors, and manufacturing the integrated circuit using the set integrated circuit parameters. The design is based on a first fabrication process.

In accordance with another embodiment, a method for manufacturing an integrated circuit is provided. The method includes receiving a design for the integrated circuit based on a first fabrication process, receiving fabrication process based parameters based on the first fabrication process and a second fabrication process, generating a layout for the design based on the second fabrication process, performing a design rule check on the layout using second fabrication process design rules, and fabricating the integrated circuit using the second fabrication process.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely integrated circuits fabricated using a fabrication process having device dimensions of 22 nm. The embodiments may also be applied, however, to fabrication processes with other device dimensions, such as 15 nm, 10 nm, 7 nm, 5 nm, and so forth. Furthermore, the embodiments may be applied to fabrication processes with device dimensions greater than 22 nm.

As fabrication processes advance and device dimensions decrease, the change in fabrication processes may be described with several scaling factors. Some of the scaling factors may be based on the fabrication processes themselves and may be fixed. A first exemplary fixed scaling factor is an area scaling factor $k_A$ and may be defined by a scaling of a specified circuit block, such as an IP block, when compared to a similar circuit block fabricated using a different fabrication process. A second exemplary fixed scaling factor is a delay scaling factor $k_t$ and may be defined as a ratio of delays between the fabrication processes. For example, the delay scaling factor $k_t$ may be defined as a ratio of the intrinsic delay of a device fabricated using the different fabrication processes. Alternatively, the delay scaling factor $k_t$ may be defined as a ratio of the delay of a circuit fabricated using the different fabrication processes.

Other scaling factors may be set by circuit designers as well as being based on the fixed scaling factors. A first exemplary settable scaling factor is a power supply voltage level scaling factor $k_V$ and may be defined as a ratio of power supply voltage levels between the fabrication processes. A second exemplary settable scaling factor is a drive current per device width scaling factor $k_I$ and may be defined as a ratio of drive current per device width between the fabrication processes. The values used in determining the settable scaling factors may be empirical values measured from actual circuits and/or simulations.

The scaling factors (both the fixed scaling factors and the settable scaling factors) may have an impact on overall performance, power consumption, power density, and so forth, of circuits fabricated using the fabrication process. Since the fixed scaling factors are dependent on the fabrication processes and typically cannot be changed once the fabrication processes are set, the settable scaling factors may be tweaked by circuit designers to achieve desired circuit characteristics.

Figure 1:
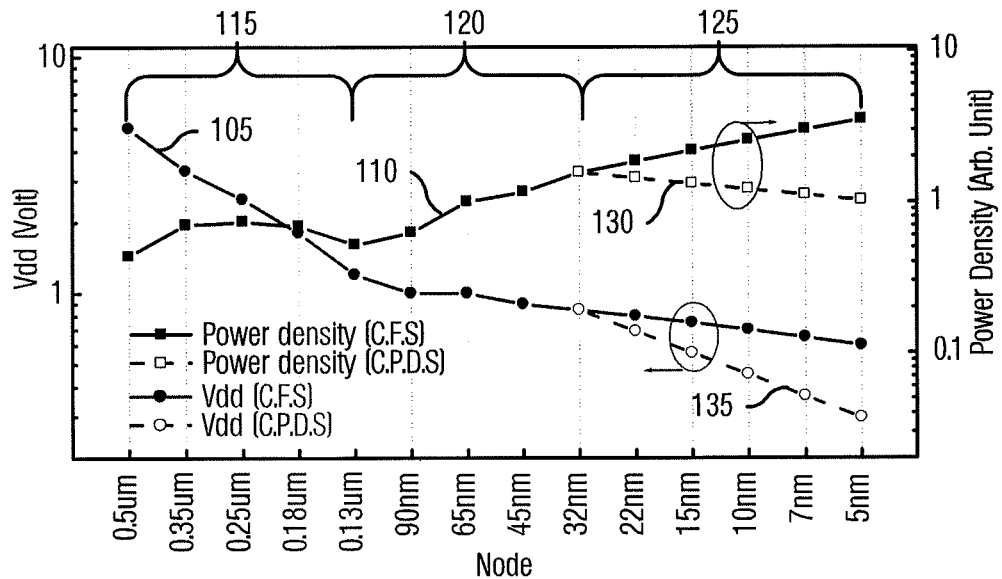
FIG. 1 is a data plot of power supply voltage level and power density versus device dimension.
Figure 2:
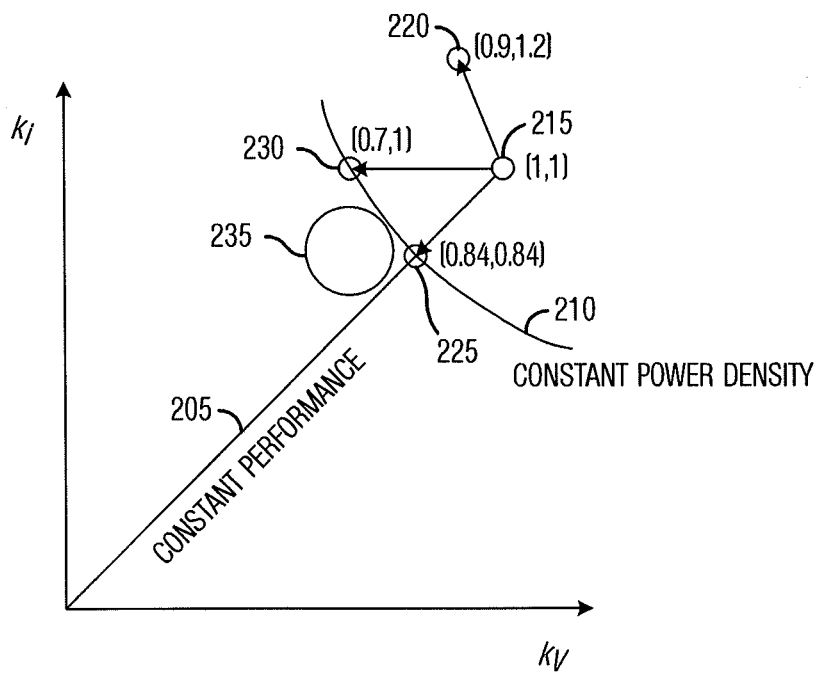
FIG. 2 is a plot of drive current per device width scaling factor versus power supply voltage level scaling factor.

FIG. 2 illustrates a plot of drive current per device width scaling factor ($k_I$) versus power supply voltage level scaling factor ($k_V$) as device dimension decreases. A straight diagonal line 205 represents a line of constant performance achieved with the same amount of scaling of the drive current per device width and power supply voltage level. A curved line 210 represents a curve of constant power density. If the drive current per device width and the power supply voltage level are scaled so that they fall upon curved line 210, power density remains constant.

A first point 215 located at (1, 1) represents no scaling of either the drive current per device width or the power supply voltage level. With the drive current per device width scaling factor at 1, no drive current per device width scaling occurs as device dimensions decrease. Similarly, with the power supply voltage level scaling factor at 1, no power supply voltage level scaling occurs as device dimensions decrease. Even with no scaling of either the drive current per device width or power supply voltage level, FIG. 2 shows that the power density will increase as the device dimensions decrease with no change in overall performance. This may be due to an increase in device density per unit area resulting from the decrease in device dimensions, i.e., more devices are packed into the unit area.

A second point 220 located at (0.9, 1.2) represents a scaling of both the drive current per device width and the power supply voltage level, wherein the power supply voltage level is slightly decreased while the drive current per device width is increased. Second point 220 represents drive current per device width and power supply voltage level scaling that is typical of process scaling occurring today. While yielding a significant increase in overall performance, there is also a dramatic increase in power density, which may lead to power related problems discussed previously.

A third point 225 located at (0.84, 0.84) represents a scaling of both the drive current per device width and the power supply voltage level, wherein both the power supply voltage level and the drive current per device width are decreased by an equal amount. Decreasing (or increasing) both the drive current per device width and the power supply voltage level by equal amounts maintains the same overall performance as device dimensions decrease. As shown in FIG. 2, scaling the drive current per device width and the power supply voltage level by 0.84 also results in maintaining a constant power density as device dimensions decrease. The scaling factor of 0.84 may be dependent on particular fabrication process parameters and may differ for different fabrication processes. Therefore, the discussion of 0.84 should not be construed as being limiting to either the scope or the spirit of the embodiments.

A fourth point 230 located at (0.7, 1) represents a scaling of just the power supply voltage level. Fourth point 230 may be illustrative of constant field scaling discussed previously. Although it is possible to increase overall performance and maintain constant power density by just scaling the power supply voltage level, it may be necessary to significantly decrease the power supply voltage level. This may lead to reliability and functionality problems as the power supply voltage level approaches electrical ground.

A region 235 represents a desirable region wherein a measurable overall performance increase is achieved with minimum scaling of both the power supply voltage level and the drive current per device width. Additionally, power density is decreased. Although shown as a circle, region 235 may be irregularly shaped and may be dependent on the fabrication processes involved.

Figure 3A:
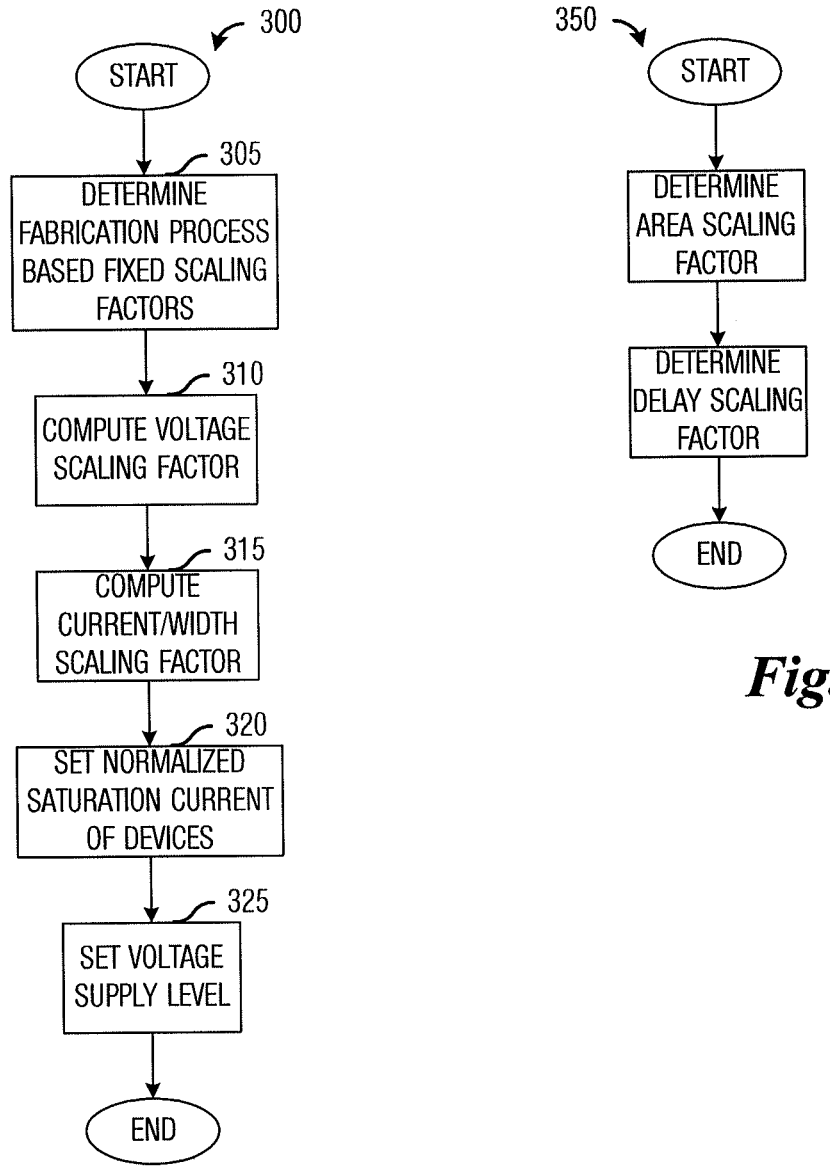
FIG. 3a is a flow diagram of operations in the computing of settable scaling factors.

FIG. 3a illustrates a flow diagram of operations 300 in computing of settable scaling factors. Operations 300 may be descriptive of steps occurring during the computing of settable scaling factors for use in designing and manufacturing an integrated circuit. Operations 300 may be based on a first fabrication process that will be used to fabricate the integrated circuit and a second fabrication process that will be used as a reference fabrication process. Generally, the first fabrication process may be a fabrication process that potentially is still under development or has just been released for fabrication of high-priced, high-performance integrated circuits. While the second fabrication process may be a well-tested, well-characterized process. For example, the second fabrication process may be a fabrication process being used for fabricating integrated circuits to be sold for general consumption. Typically, device dimensions producible by the first fabrication process will be smaller than device dimensions producible by the second fabrication process.

Figure 3B:
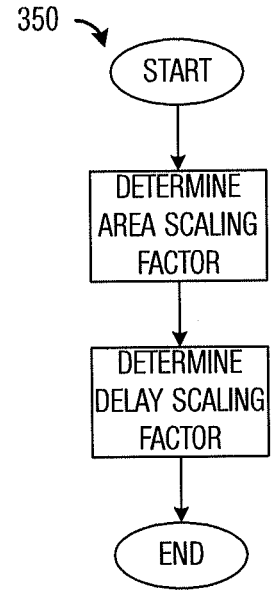
FIG. 3b is a flow diagram of operations in the computing of fixed scaling factors.

Operations 300 may begin with determining fixed scaling factors based on the first fabrication process and the second fabrication process (block 305). As discussed previously, fixed scaling factors may include an area scaling factor $k_A$ and a delay scaling factor $k_t$. The area scaling factor $k_A$ may be determined by comparing similar (or the same) circuit blocks as implemented using the first fabrication process and the second fabrication process. For example, if the first fabrication process has a device dimension of 22 nm and the second fabrication process has a device dimension of 45 nm, then the area scaling factor $k_A$ may be 22/45 or about 0.49. The delay scaling factor $k_t$ may be determined by comparing delays through similar (or the same) devices or circuit blocks. For example, an intrinsic delay through an inverter is about 2.5 ps when the inverter is fabricated using the first fabrication process and about 5 ps when the inverter is fabricated using the second fabrication process, then the delay scaling factor $k_t$ may be 2.5/5 or about 0.50. FIG. 3b illustrates a flow diagram of operations 350 in computing fixed scaling factors for the first fabrication process and the second fabrication process.

Returning now to FIG. 3a, after computing the fixed scaling factors, the settable scaling factors may be computed (blocks 310 and 315). Relationships between the fixed scaling factors and the settable scaling factors so that the settable scaling factors fall within a desirable region, such as region 235 of FIG. 2, may be expressed as:

$$k_V \cdot k_I \le \sqrt{k_A} \cdot k_t,$$

and $$\frac{k_V}{k_I} \le k_t,$$

where $k_I$ is the drive current per device width scaling factor, $k_V$ is the power supply voltage level scaling factor, $k_A$ is the area scaling factor, and $k_t$ is the delay scaling factor. The two relationships may be combined to solve for $k_V$, which may be expressed as:

$$k_V \le \sqrt[4]{k_A} \cdot k_t.$$

A detailed description of the relationships is provided below.

Let the power per gate or per logic cell be defined as $$P = I_{DSAT} \cdot V_{DD}.$$

where $I_{DSAT}$ is the drain saturation current and $V_{DD}$ is the power supply voltage level. The power density may then be defined as $$P.D. = \frac{I_{DSAT} \cdot V_{DD}}{Area} \propto \frac{I_{DSAT} \cdot V_{DD}}{W \cdot L} = \frac{I_{DSAT}}{W} \cdot \frac{V_{DD}}{L},$$

where W is transistor width or standard cell height and L is transistor gate dimension or standard cell width.

Constant power density may be achieved by scaling $V_{DD}$ with a scaling constant k, expressible as:

$$P.D. \propto \frac{I_{DSAT} \cdot V_{DD}}{W \cdot L} = \frac{I_{DSAT}}{W} \cdot \frac{V_{DD}}{L} = \left(\frac{I_{DSAT}}{W} \cdot V_{DD}\right) \cdot k \frac{1}{L \cdot k}$$

The scaling of $V_{DD}$ with the scaling constant k is known as constant field scaling, as discussed above.

Alternatively, constant power density scaling may be achieved by scaling the product $$\frac{I_{DSAT}}{W} \cdot V_{DD}$$

with the scaling constant k. When the above equation is satisfied, the power density remains constant, but potentially with a different delay.

Intrinsic delay t is expressible as:

$$t \propto \frac{C_{OX} \cdot W \cdot L \cdot V_{DD}}{I_{DSAT}} = L \cdot k \cdot \frac{1}{T_{inv} \cdot k} \frac{V_{DD}}{\left(\frac{I_{DSAT}}{W}\right)},$$

where $C_{OX}$ is gate oxide capacitance and $T_{inv}$ is equivalent gate oxide thickness.

Since a minimum requirement is no delay degradation, it is needed that $$\frac{V_{DD}}{\left(\frac{I_{DSAT}}{W}\right)}$$

does not scale.

Therefore, it can be shown that the minimum requirement for the power supply voltage level scaling factor is $\sqrt{k}$. This may be referred to as constant delay scaling.

The target drive current per device width and the power supply voltage level may then be set using the settable scaling factors (block 320 and 325). Operations 300 may then terminate.

As an example, for fabrication processes with device dimensions smaller than 130 nm, including but not limited to fabrication processes with device dimensions of 45 nm and 22 nm, circuits may be implemented with an area scaling factor $k_A$ and a delay scaling factor $k_t$. Based on the two fixed scaling factors, a power supply voltage scaling factor $k_V$ may a scaled down by the area scaling factor, and may be expressed as:

$$0.9 \times \sqrt[4]{k_A} \le k_V \le \sqrt[4]{k_A}$$

With the exception of fabrication processes with device dimensions of 130 nm and 90 nm, the above specified power supply voltage level scaling factor was not used since it violated either the lower bound (between 0.5 um and 0.13 um) or the upper bound (between 0.13 um and 32 nm).

Also based on the two fixed scaling factors, a drive current per device width scaling factor $k_I$ may scale up by the area scaling factor, and may be expressed as:

$$\sqrt[4]{k_A} \le k_I \le 1.1 \cdot \sqrt[4]{k_A}$$

Figure 4:
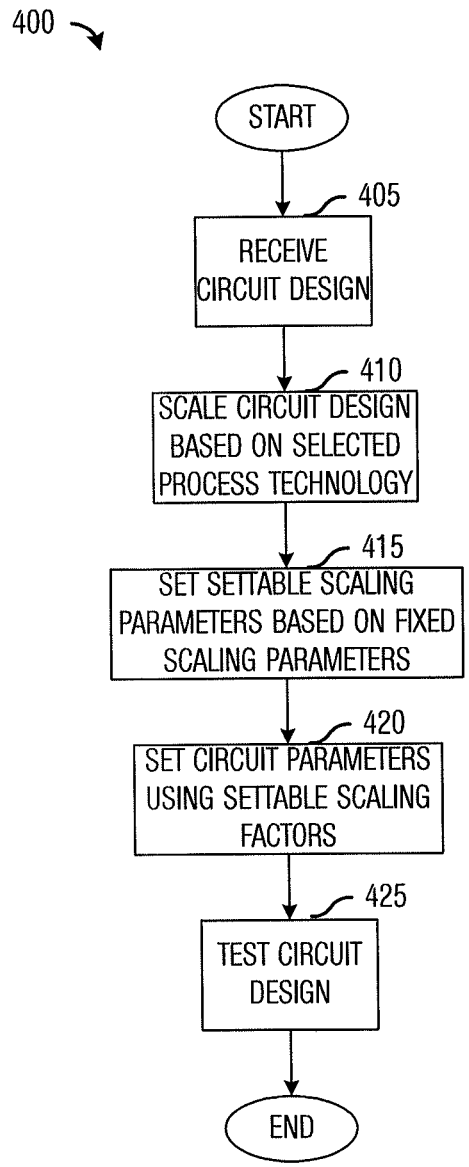
FIG. 4 is a flow diagram of operations in the scaling of an existing integrated circuit design.

FIG. 4 illustrates a flow diagram of operations 400 in the scaling of an existing integrated circuit design between a first fabrication process and a second fabrication process. Operations 400 may be based on a first fabrication process that will be used to fabricate the integrated circuit and a second fabrication process that will be used as a reference fabrication process. The first fabrication process may be used to create devices with a smaller device dimension than the second fabrication process.

Operations 400 may begin with receiving a circuit design of an integrated circuit that is to be scaled (block 405). The circuit design may include a layout, a netlist, and so forth, of the integrated circuit that meets the design rules and other requirements of the second fabrication process. The circuit design may also include references to design libraries specific to the second fabrication process. The circuit design may then be scaled to the first fabrication process parameters (block 410).

The scaling of the circuit design may include simply resizing portions of the circuit design, as well as re-designing or altering portions of the circuit design that may not be amenable to being resized. Additionally, the design libraries specific to the second fabrication process may be replaced with a design library specific to the first fabrication process. The techniques involved in the scaling of a circuit design are considered to be well known by those of ordinary skill in the art of the embodiments and will not be discussed further herein.

Additionally, settable scaling factors, such as a power supply voltage level scaling factor $k_V$ and a drive current per device width scaling factor $k_I$, may be set based on fixed scaling factors (area scaling factor $k_A$ and delay scaling factor $k_t$, for example) (block 415). As discussed previously, fixed scaling factors are based on physical differences between the first fabrication process and the second fabrication process, such as device dimension, propagation delay, and so forth. Settable scaling factors may specify parameters of the integrated circuit and may have an impact on the performance of the integrated circuit.

Circuit parameters, such as power supply voltage level and normalized saturation current, may also be set (block 420). The circuit parameters may be set based on settable scaling factors, such as power supply voltage level scaling factor $k_V$ and drive current per device width scaling factor $k_I$. The circuit parameters may be set as a function of similar circuit parameters for the circuit design when fabricated using the second fabrication process. For example, when transitioning from a fabrication process with 45 nm device dimensions to a fabrication process with 22 nm device dimensions, the power supply voltage level may range from about 0.9 to about 1.0 times a fourth-root of the area scaling factor $k_A$ of the two fabrication processes. Similarly, drive current per device width may range from about 1.0 to about 1.1 times the fourth-root of the area scaling factor $k_A$.

With the circuit design scaled and circuit parameters adjusted, the circuit design may be tested (block 425). Testing of the circuit design may include simulations to verify correctness of the circuit design, as well as testing to ensure that parameters, such as power consumption, delays, and so forth, of the circuit are met. If the circuit design passes testing, then the circuit design operations 400 may then terminate. If the circuit design does not pass testing, then modifications to the circuit design may be needed.

Figure 5:
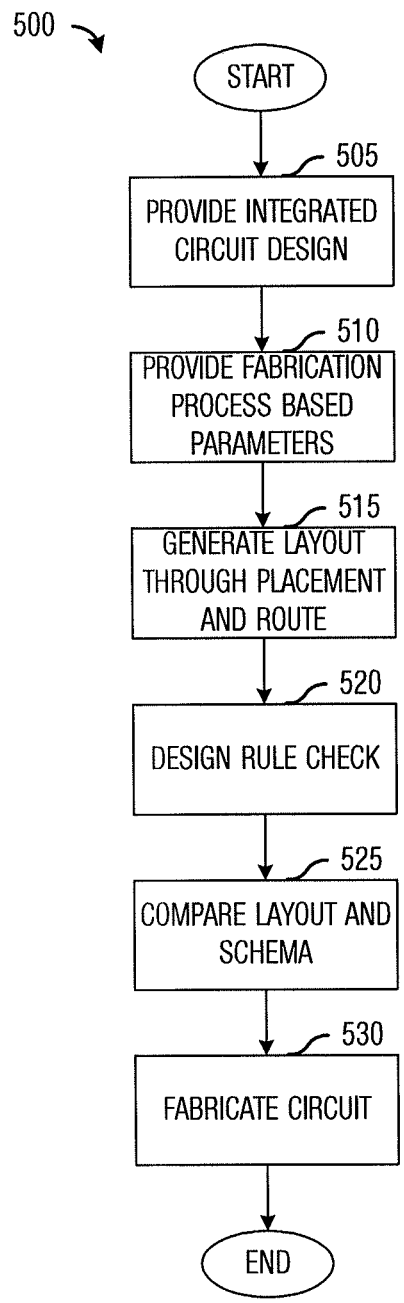
FIG. 5 is a flow diagram of operations in the manufacturing of an integrated circuit.

FIG. 5 illustrates a flow diagram of operations 500 in the manufacture of an integrated circuit. Operations 500 may make use of differences, such as differences in area, delay, and so forth, between a first fabrication process and a second fabrication process to help manufacture the integrated circuit so that the integrated circuit meets design criteria. Examples of design criteria include better overall performance, lower power density, lower power consumption, and so forth. The first fabrication process may be capable of producing devices with a smaller device dimension than the second fabrication process.

Operations 500 may begin with a circuit design (block 505). The circuit design may be an existing design or a new design. Fabrication process based parameters may be provided (block 510). Fabrication process based parameters may include fixed scaling factors, such as an area scaling factor $k_A$ and a delay scaling factor $k_t$, and settable scaling factors, such as a power supply voltage level scaling factor $k_V$ and a drive current per device width scaling factor $k_I$, which may be based on the fixed scaling factors and specified performance criteria. The fixed scaling factors may be computed a priori and stored for subsequent use in, e.g., a computer readable medium, while the settable scaling factors may be computed as needed. The settable scaling factors may also be based on performance requirements of the integrated circuit, such as overall performance, power density, power consumption, power dissipation, and so forth. The fabrication process based parameters may be used to specify circuit characteristics, such as power supply voltage level, drive current per device width, and so forth. The fabrication process based parameters may have an impact on the circuit design.

The circuit design, in combination with the fabrication process based parameters, may then be used to create a circuit layout (block 515). The circuit layout may be created using a place and route application, for example. A design rule check may then be performed to help ensure that the circuit layout satisfies the design rules of the first fabrication process (block 520). A comparison between the final circuit design (circuit layout) to original design specifications (schema) may be performed to help ensure that the circuit design fully matches the original design. The comparison may be performed by using SPICE, for example. The circuit design may then be fabricated (block 530). After fabrication, the manufacture of the circuit may continue with testing of the fabricated integrated circuits, dicing, packaging, and so forth.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a circuit, the method comprising:

receiving a design for an integrated circuit based on a first fabrication process, the design comprising at least a reference to at least one first design library associated with the first fabrication process;

scaling, by resizing, physical dimensions of a first part of the integrated circuit comprising scalable circuit elements resizable for fabrication according to a second fabrication process creating devices having a smaller device dimension than the first fabrication process;

altering a second part of the integrated circuit comprising un-scalable circuit elements non-amenable to resizing for fabrication according to the second fabrication process, altering comprising changing a design of the second part of the integrated circuit;

computing at least one settable scaling factor for the integrated circuit with a power density of the integrated circuit remaining substantially constant or decreasing, the at least one settable scaling factor based on a feature of the integrated circuit fabricated according to the first fabrication process in relation to a feature of the integrated circuit fabricated according to the second fabrication process, the at least one settable scaling factor further based on at least one fixed scaling factor that is based on the fabrication processes and indicating a ratio of a feature of the integrated circuit fabricated according to a first fabrication process to a feature of the integrated circuit fabricated according to a second fabrication process;

setting, by using a computer, integrated circuit parameters based on the at least one settable scaling factor; and manufacturing the integrated circuit using the integrated circuit parameters;

wherein the at least one fixed scaling factor further comprises an area scaling factor, wherein the at least one fixed scaling factor further comprises at least a delay scaling factor and wherein the at least one settable scaling factor further comprises a voltage level scaling factor, and wherein a relationship between the voltage level scaling factor and the at least one fixed scaling factor is expressible as $$k_V \leq \sqrt[4]{k_A} \cdot k_t.$$

where $k_V$ is the voltage level scaling factor, $k_A$ is the area scaling factor, and $k_t$ is the delay scaling factor.

2. The method of claim 1, wherein the at least one settable scaling factor further comprises a drive current per device width scaling factor.

3. The method of claim 2, wherein a relationship between the drive current per device width scaling factor and the at least one fixed scaling factor is expressible as $$\frac{k_V}{k_I} \leq k_t,$$

where $k_V$ is the voltage level scaling factor, $k_I$ is the drive current per device width scaling factor, and $k_t$ is the delay scaling factor.

4. The method of claim 2, wherein the at least one fixed scaling factor further comprises an area scaling factor, and wherein the at least one settable scaling factor further comprises a voltage level scaling factor, and wherein a relationship between the voltage level scaling factor and the at least one fixed scaling factor is expressible as $$k_V \leq \sqrt[4]{k_A}$$

where $k_V$ is the voltage level scaling factor and $k_A$ is the area scaling factor.

5. The method of claim 1, wherein the area scaling factor is proportional to a ratio of a first minimum device dimension of a device created using the first fabrication process to a second minimum device dimension of a device created using the second fabrication process.

6. The method of claim 1, wherein the at least one settable scaling factor further comprises a drive current per device width scaling factor.

7. The method of claim 6, wherein a relationship between the drive current per device width scaling factor and the at least one fixed scaling factor is expressible as $$\frac{k_V}{k_I} \leq k_t,$$

where $k_V$ is the voltage level scaling factor, $k_I$ is the drive current per device width scaling factor, and $k_t$ is the delay scaling factor.

8. A method of manufacturing an integrated circuit, the method comprising:

determining at least one settable scaling factor for the integrated circuit to be fabricated using a first fabrication process, wherein the at least one settable scaling factor indicates an operating characteristic of a feature of the integrated circuit to be fabricated according to the first fabrication process, and wherein the at least one settable scaling factor is computed based on at least one fixed scaling factor while a power density of the integrated circuit remains substantially constant or decreasing;

determining parameters, by using a computer, of the integrated circuit to be fabricated according to a second fabrication process and based on the at least one settable scaling factor; and manufacturing the integrated circuit using the parameters;

wherein the at least one fixed scaling factor indicates a ratio of a feature of the integrated circuit fabricated according to a first fabrication process to a feature of the integrated circuit fabricated according to a second fabrication process, wherein the fixed scaling factors are based on the fabrication processes, wherein the first fabrication process creates devices having a smaller device dimension than the second fabrication process; and wherein the at least one fixed scaling factor comprises at least a delay scaling factor based on the delay of an integrated circuit fabricated according to the first and second fabrication processes;

wherein the at least one fixed scaling factor further comprises an area scaling factor based on the area of an integrated circuit fabricated according to the first and second fabrication processes;

wherein the at least one settable scaling factor further comprises a voltage level scaling factor indicating a ratio of power supply voltage levels between a device fabricated according to the first and second fabrication processes and a drive current per device width scaling factor indicating a ratio of drive current per device width between a device fabricated according to the first and second fabrication processes; and wherein a relationship between the voltage level scaling factor and the at least one fixed scaling factor is expressible as:

$$k_V \leq \sqrt[4]{k_A} \cdot k_t,$$

where $k_V$ is the voltage level scaling factor, $k_A$ is the area scaling factor, and $k_t$ is the delay scaling factor.

9. The method of claim 8, wherein the area scaling factor is proportional to a ratio of a first minimum device dimension of a device created using the first fabrication process to a second minimum device dimension of a device created using the second fabrication process.

10. The method of claim 8, wherein the delay scaling factor is proportional to a ratio of a single device delay of a device created using the first fabrication process to a single device delay of a device created using the second fabrication process.

11. The method of claim 8, wherein the voltage scaling factor is smaller than a fourth-root of the area scaling factor.

12. The method of claim 8, wherein a device dimension of the first fabrication process is 22 nm and a device dimension of the second fabrication process is 45 nm, and wherein the voltage scaling factor is chosen from a range of about 0.9 to about 1.0 times a fourth-root of the area scaling factor.

13. The method of claim 8, wherein a relationship between the voltage level scaling factor, the drive current per device width scaling factor, and the fixed scaling factors are expressible as:

$$\frac{k_V}{k_I} \leq k_t,$$

where $k_V$ is the voltage level scaling factor, $k_I$ is the drive current per device width scaling factor, and $k_t$ is the delay scaling factor.

14. A method of manufacturing an integrated circuit, the method comprising:
  determining at least one settable scaling factor for the integrated circuit to be fabricated using a first fabrication process, wherein the at least one settable scaling factor indicates an operating characteristic of a feature of the integrated circuit to be fabricated according to the first fabrication process, and wherein the at least one settable scaling factor is computed based on at least one fixed scaling factor while a power density of the integrated circuit remains substantially constant or decreasing;
  determining parameters, by using a computer, of the integrated circuit to be fabricated according to a second fabrication process and based on the at least one settable scaling factor; and
  manufacturing the integrated circuit using the parameters; and
  wherein the at least one fixed scaling factor comprises at least a delay scaling factor based on the delay of an integrated circuit fabricated according to the first and second fabrication processes;
  wherein the at least one settable scaling factor further comprises a voltage level scaling factor indicating a ratio of power supply voltage levels between a device fabricated according to the first and second fabrication processes and a drive current per device width scaling factor indicating a ratio of drive current per device width between a device fabricated according to the first and second fabrication processes; and
  wherein a relationship between the voltage level scaling factor, the drive current per device width scaling factor, and the fixed scaling factors are expressible as:

$$\frac{k_V}{k_I} \leq k_t,$$

where $k_V$ is the voltage level scaling factor, $k_I$ is the drive current per device width scaling factor, and $k_t$ is the delay scaling factor.

15. The method of claim 14, wherein the drive current per device width scaling factor is larger than a fourth-root of the area scaling factor.

16. The method of claim 14, wherein a device dimension of the first fabrication process is 22 nm and a device dimension of the second fabrication process is 45 nm, and wherein the drive current per device width scaling factor is chosen from a range of about 1.0 to 1.1 times a fourth-root of the area scaling factor.

17. The method of claim 14, wherein determining parameters comprises:
  setting a power supply voltage to be substantially equal to a power supply voltage used for an integrated circuit fabricated using the second fabrication process multiplied by the voltage level scaling factor; and
  setting a target drive current per device width to be substantially equal to a target drive current per device width of the integrated circuit fabricated using the second fabrication process multiplied by the drive current per device width scaling factor.

18. The method of claim 14, wherein the at least one fixed scaling factor comprises an area scaling factor which indicates a ratio of an area of a feature of the integrated circuit fabricated according to a first fabrication process to a feature of the integrated circuit fabricated according to a second fabrication process.

19. The method of claim 18, wherein the area scaling factor is proportional to a ratio of a first minimum device dimension of a device created using the first fabrication process to a second minimum device dimension of a device created using the second fabrication process.

20. The method of claim 14, wherein the determining the at least one fixed scaling factor comprises retrieving at least one fixed scaling factor retrieved from storage.

* * * * *